United States Patent
Chisholm et al.

(10) Patent No.: US 6,258,205 B1
(45) Date of Patent: Jul. 10, 2001

(54) ENDPOINT DETECTION METHOD AND APPARATUS WHICH UTILIZE AN ENDPOINT POLISHING LAYER OF CATALYST MATERIAL

(75) Inventors: Brynne K. Chisholm, Garland, TX (US); Gayle W. Miller; Gail D. Shelton, both of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/534,652

(22) Filed: Mar. 24, 2000

Related U.S. Application Data

(62) Division of application No. 09/109,331, filed on Jun. 30, 1998, now Pat. No. 6,071,818.

(51) Int. Cl.[7] .................................................. H01L 21/302
(52) U.S. Cl. ........................ 156/345; 451/66; 451/39; 451/259; 451/282; 51/306; 216/84; 216/88; 216/89; 216/90; 216/93; 216/95
(58) Field of Search ......................... 156/345; 451/66, 451/39, 282, 259; 51/306; 216/84, 88, 89, 90, 93, 95; 222/26, 190; 118/688, 689; 438/5

(56) References Cited

U.S. PATENT DOCUMENTS

| | | |
|---|---|---|
| 3,734,620 | 5/1973 | Cade . |
| 3,748,014 | 7/1973 | Beiser . |
| 4,312,732 | 1/1982 | Degenkolb et al. . |
| 4,374,915 | 2/1983 | Ahlquist et al. . |
| 4,632,724 | 12/1986 | Chesebro et al. . |
| 4,689,491 | 8/1987 | Lindow et al. . |
| 4,793,895 | 12/1988 | Kaanta et al. . |
| 5,036,015 | 7/1991 | Sandhu et al. . |
| 5,081,421 | 1/1992 | Miller et al. . |
| 5,151,584 | 9/1992 | Ebbing et al. . |
| 5,169,491 | 12/1992 | Doan . |
| 5,196,353 | 3/1993 | Sandhu et al. . |
| 5,222,329 | 6/1993 | Yu . |
| 5,240,552 | 8/1993 | Yu et al. . |
| 5,245,790 | 9/1993 | Jerbic . |
| 5,245,794 | 9/1993 | Salugsugan . |
| 5,258,093 | 11/1993 | Maniar . |
| 5,265,378 | 11/1993 | Rostoker . |
| 5,272,115 | 12/1993 | Sato . |
| 5,308,438 | 5/1994 | Cote et al. . |
| 5,310,455 | 5/1994 | Pasch et al. . |
| 5,321,304 | 6/1994 | Rostoker . |
| 5,337,015 | 8/1994 | Lustig et al. . |
| 5,362,669 | 11/1994 | Boyd et al. . |
| 5,385,866 | 1/1995 | Bartush . |
| 5,389,194 | 2/1995 | Rostoker et al. . |
| 5,399,234 | 3/1995 | Yu et al. . |
| 5,403,228 | 4/1995 | Pasch . |
| 5,405,806 | 4/1995 | Pfiester et al. . |
| 5,439,551 | 8/1995 | Meikle et al. . |
| 5,449,314 | 9/1995 | Meikle et al. . |
| 5,483,568 | 1/1996 | Yano et al. . |
| 5,492,594 | 2/1996 | Burke et al. . |
| 5,516,400 | 5/1996 | Pasch et al. . |
| 5,531,861 | 7/1996 | Yu et al. . |
| 5,559,428 | 9/1996 | Li et al. . |
| 5,561,541 | 10/1996 | Sharp et al. . |
| 5,595,526 | 1/1997 | Yau et al. . |
| 5,597,442 | 1/1997 | Chen et al. . |
| 5,597,590 | 1/1997 | Tanimoto et al. . |

(List continued on next page.)

Primary Examiner—Jeffrie R. Lund
Assistant Examiner—Sylvia R MacArthur

(57) ABSTRACT

An apparatus for planarizing a semiconductor wafer having a polishing endpoint layer that includes a catalyst material is disclosed. The apparatus is operable to detect the endpoint based upon the chemical slurry whether a catalytic reaction has occurred due to the polishing platen removing a portion of the catalyst material from the wafer.

8 Claims, 3 Drawing Sheets

U.S. PATENT DOCUMENTS

| | | |
|---|---|---|
| 5,607,341 | 3/1997 | Leach . |
| 5,609,511 | 3/1997 | Moriyama et al. . |
| 5,614,446 | 3/1997 | Ramaswami et al. . |
| 5,624,304 | 4/1997 | Pasch et al. . |
| 5,626,715 | 5/1997 | Rostoker . |
| 5,627,110 | 5/1997 | Lee et al. . |
| 5,637,185 | 6/1997 | Muraka et al. . |
| 5,639,388 | 6/1997 | Kimura et al. . |
| 5,643,046 | 7/1997 | Katakabe et al. . |
| 5,643,050 | 7/1997 | Chen . |
| 5,643,061 | 7/1997 | Jackson et al. . |
| 5,644,221 | 7/1997 | Li et al. . |
| 5,645,682 | 7/1997 | Skrovan . |
| 5,647,952 | 7/1997 | Chen . |
| 5,656,229 | 8/1997 | Tanimoto et al. . |
| 5,658,183 | 8/1997 | Sandhu et al. . |
| 5,660,672 | 8/1997 | Li et al. . |
| 5,663,101 | 9/1997 | Cronin . |
| 5,663,797 | 9/1997 | Sandhu . |
| 5,664,987 | 9/1997 | Rentein . |
| 5,667,424 | 9/1997 | Pan . |
| 5,667,433 | 9/1997 | Mallon . |
| 5,667,629 | 9/1997 | Pan et al. . |
| 5,668,063 | 9/1997 | Fry et al. . |
| 5,670,410 | 9/1997 | Pan . |
| 5,672,091 | 9/1997 | Takahashi et al. . |
| 5,674,784 | 10/1997 | Jang et al. . |
| 5,681,215 | 10/1997 | Sherwood . |
| 5,691,253 | 11/1997 | Kobayashi . |
| 5,695,660 | 12/1997 | Litvak . |
| 5,700,180 | 12/1997 | Sandhu et al. . |
| 5,702,292 | 12/1997 | Brunelli et al. . |
| 5,704,987 | 1/1998 | Huynh et al. . |
| 5,705,320 | 1/1998 | Hsu et al. . |
| 5,705,435 | 1/1998 | Chen . |
| 5,710,076 | 1/1998 | Dai et al. . |
| 5,712,185 | 1/1998 | Tsai et al. . |
| 5,716,873 | 2/1998 | Prall et al. . |
| 5,720,845 | 2/1998 | Liu . |
| 5,722,875 | 3/1998 | Iwashita et al. . |
| 5,722,877 | 3/1998 | Meyer et al. . |
| 5,725,417 | 3/1998 | Robinson . |
| 5,736,462 | 4/1998 | Takahashi et al. . |
| 5,738,567 | 4/1998 | Manzonie et al. . |
| 5,741,171 | 4/1998 | Sarfaty et al. . |
| 5,747,380 | 5/1998 | Yu et al. . |
| 5,755,614 | 5/1998 | Adams et al. . |
| 5,762,536 | 6/1998 | Pant et al. . |
| 5,762,537 | 6/1998 | Sandhu et al. . |
| 5,777,739 | 7/1998 | Sandhu et al. . |
| 5,795,495 | 8/1998 | Meikle . |
| 5,861,055 | 1/1999 | Allman et al. . |
| 5,865,666 | 2/1999 | Nagahara . |
| 5,868,608 | 2/1999 | Allman et al. . |
| 5,882,244 | 3/1999 | Hiyama et al. . |
| 5,882,251 | 3/1999 | Berman et al. . |
| 5,888,120 | 3/1999 | Doran . |
| 5,893,756 | 4/1999 | Berman et al. . |
| 5,931,719 | 8/1999 | Nagahara et al. . |
| 5,948,697 | 9/1999 | Hata . |
| 5,957,757 | 9/1999 | Berman . |
| 6,071,818 * | 6/2000 | Chisholm et al. .................... 438/692 |
| 6,126,848 * | 10/2000 | Li et al. ................................ 216/85 |

* cited by examiner

ENDPOINT DETECTION METHOD AND APPARATUS WHICH UTILIZE AN ENDPOINT POLISHING LAYER OF CATALYST MATERIAL

This application is a divisional of then application Ser. No. 09/109,331, filed on Jun. 30,1998, now U.S. Pat. No. 6,071,818.

BACKGROUND OF THE INVENTION

The present invention relates generally to an endpoint detection method and apparatus, and more particularly to method and apparatus that polish a semiconductor wafer down to a polishing endpoint layer that contains catalyst material.

Semiconductor integrated circuits are typically fabricated by a layering process in which several layers of material are fabricated (i) on or in a surface of a wafer, or (ii) on a surface of a previous layer. This fabrication process very often requires layers to be fabricated upon a smooth, planar surface of a previous layer. However, the surface topography of layers may be highly uneven due to (i) areas which are higher than the remainder of the surface or (ii) an uneven topography of an underlying layer. As a result, a layer may need to be polished so as to present a smooth planar surface for the next processing step, such as formation of a conductor layer or pattern on the surface of another layer.

In general, a semiconductor wafer may be polished to remove high topography and surface defects such as crystal lattice damage, scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate (i) higher removal rates, and (ii) selective removal of materials fabricated upon the semiconductor wafer. This polishing process is often referred to as chemical mechanical planarization or chemical mechanical polishing (CMP).

In these polishing processes, it is often important to determine an endpoint of the polishing process. Overpolishing (removing too much) of a conductive layer results in increased circuit resistance and potential scrapping of the semiconductor wafer. Since many processing steps have occurred prior to the polishing process, scrapping a semiconductor wafer during fabrication may result in a significant financial loss. Underpolishing (removing too little) of a conductive layer on the other hand leads to failure in isolating circuits and results in electrical shorts, which leads to rework (redoing the CMP process) which raises the cost of production. Thus, a precise endpoint detection technique is needed.

A typical method employed for determining endpoint in polishing systems is to measure the amount of time needed to planarize a first wafer, and then to run the remaining wafers for similar times. In practice this method is extremely time consuming, since operators must inspect each wafer after polishing. This is because it is extremely difficult to precisely control the removal rate of material since the removal rate may vary during the polishing of an individual wafer or because the removal rate may diminish in the process of polishing a number of wafers in sequence.

Another method employed for determining endpoint in polishing systems is to (i) form a polishing endpoint layer in the semiconductor device, and (ii) polish the semiconductor device down to the polishing endpoint layer. To this end, polishing systems detect when the polishing process reaches the polishing endpoint layer and terminate the polishing process in response to reaching the polishing endpoint layer. Various techniques have been used to detect when the polishing process reaches the polishing endpoint layer. For example, U.S. Pat. No. 5,668,063 to Fry et al polishes a semiconductor device down to a tracer layer of detectable material. The polishing system of Fry determines that the tracer layer has been reached when a chemical element detector detects materials such as boron or phosphorous of the tracer layer have been removed by the polishing process.

In order to base endpoint detection upon detecting material of the tracer layer, the chemical element detector needs to accurately detect rather small amounts of the tracer layer material, or the polishing system needs to remove more of the tracer layer material in order to provide the chemical element detector with enough material for accurate detection. The above is also true if the material of the tracer layer is consumed as a reagent of a chemical reaction to be detected by the detector. In this case, the detector would need to be able to detect the effect of a small reaction, or the polishing system would need to remove more of the tracer layer in order to provide enough tracer material for a substantial reaction to occur.

Detectors capable of detecting small amounts of the tracer layer or detecting the effect of a small chemical reaction are more expensive than detectors capable of detecting larger amounts of the tracer layer or detecting the effect of a larger chemical reaction. Furthermore, the additional removal of the tracer layer in order to provide more tracer layer material for detection increases the risk of overpolishing especially when the topography of the tracer layer is highly uneven.

Thus, a continuing need exists for a method and an apparatus which accurately and efficiently detects when a polishing system polishes a semiconductor device down to a polishing endpoint layer.

SUMMARY OF THE INVENTION

In accordance with one embodiment of the present invention, there is provided a method of planarizing a semiconductor wafer having a polishing endpoint layer that includes a catalyst material. One step of the method includes polishing a first side of the wafer in order to remove material from the wafer. Another step of the method includes determining that a catalytic reaction has occurred due to the polishing step removing the catalyst material of the polishing endpoint layer. The method also includes the step of terminating the polishing step in response to determining that the catalytic reaction has occurred.

Pursuant to another embodiment of the present invention, there is provided a method of planarizing a semiconductor wafer down to a predetermined distance from a semiconductor substrate of the wafer. One step of the method includes forming in the wafer a catalyst material that is at the predetermined distance from the substrate of the wafer. Another step of the method includes polishing a first side of the wafer in order to remove material from the wafer. The method also includes the step of determining that a catalytic reaction has occurred due to the polishing step removing a portion of the catalyst material from the wafer. Moreover, the method includes the step of terminating the polishing step in response to determining that the catalytic reaction has occurred.

Pursuant to yet another embodiment of the present invention, there is provided an apparatus for polishing a semiconductor wafer down to a catalyst material of the wafer. The apparatus includes a polishing platen having a polishing surface, a wafer carrier, a slurry supply system, and a polishing endpoint detector. The wafer carrier is configured to (i) engage the wafer by the second side of the wafer and (ii) press the first side of the wafer against the polishing surface of the polishing platen. The slurry supply system is configured to apply a chemical slurry to the first side of the wafer which (i) facilities removal of material from the wafer, and (ii) receives the material removed from the wafer carrier. The polishing platen and the wafer carrier are configured to rub the first side of the wafer against the polishing surface in the presence of the chemical slurry in order to remove the material from the wafer. The polishing endpoint detector is operable to (i) detect based upon the chemical slurry whether a catalytic reaction has occurred due to the polishing platen removing a portion of the catalyst material from the wafer. Moreover, the polishing endpoint detector is operable to cause the polishing of the wafer to terminate in response to detecting the catalytic reaction.

It is an object of the present invention to provide an improved method and apparatus for determining an endpoint of a polishing process.

It is an object of the present invention to provide a new and useful method and apparatus for determining an endpoint of a polishing process.

It is also an object of the present invention to provide a method and apparatus which accurately and efficiently detect when a polishing system polishes a semiconductor device down to a polishing endpoint layer.

It is a further object of the present invention to provide a method and apparatus for determining that a polishing system has polished a device down to a polishing endpoint without removing the device from the polishing system.

It is yet another object of the present invention to provide a method and apparatus which generate a relatively large chemical reaction as compared to the amount of material removed from a polishing endpoint layer.

The above and other objects, features, and advantages of the present invention will become apparent from the following description and the attached drawings.

DETAILED DESCRIPTION OF A PREFERRED EMBODIMENT

Figure 1A:
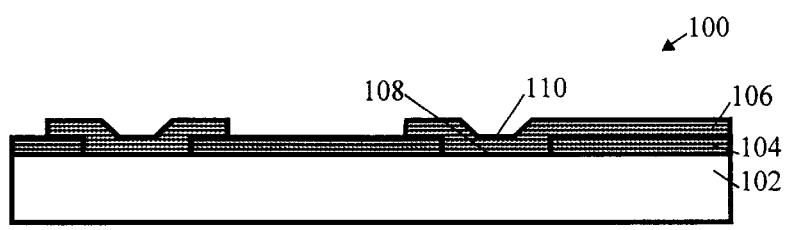
FIGS. 1A–1F show sectional views of a semiconductor wafer during various steps of a fabrication process.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

As stated above, a semiconductor wafer after various steps of a fabrication process needs to be planarized in order to remove rough topography from the surface of the semiconductor wafer. FIGS. 1A–1F illustrate sectional views of a semiconductor wafer 100 after various steps of a fabrication process of the present invention. In particular, FIGS. 1A–1F illustrate planarizafion of a semiconductor 100 down to a polishing endpoint layer 118.

FIG. 1A shows the semiconductor wafer 100 after a number of fabrication steps. As shown, the semiconductor wafer 100 includes a semiconductor substrate 102 upon which a fabrication process formed a first insulating layer 104 and a first metal layer 106. In particular, the fabrication process formed the first insulating layer 104 upon the semiconductor substrate 102, and a contact hole 108 in the first insulating layer 104 at a location above a transistor portion (not shown) of the semiconductor substrate 102. Moreover, the fabrication process patterned the first metal layer 106 (e.g. aluminum) over the first insulating layer 104 and the contact hole 108. As a result, the first metal layer 106 fills the contact hole 108 forming an electrical contact with the transistor portion of the semiconductor substrate 102. Moreover, the filling of the contact hole 108 forms a pit 110 in the portion of the first metal layer 106 lying above the contact hole 108.

Figure 1B:
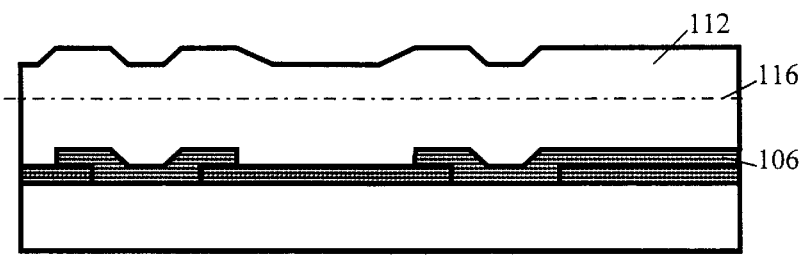

The semiconductor wafer 100 is shown in FIG. 1B after the fabrication process formed a second insulating layer 112 upon the surface of the semiconductor wafer 100. As shown in FIG. 1B, the second insulating layer 112 has a highly uneven surface topography. The uneven surface topography of the second insulating layer 112 would cause accuracy problems in fabricating additional layers of the semiconductor wafer 100. For example, the uneven surface topography would cause control problems for a lithography process used to pattern a second metal layer 120 (FIG. 1F) upon the second insulating layer 112. In order to avoid the accuracy problems associated with the uneven topography of the second insulating layer 112, a polishing system such as the polishing system 210 of FIG. 2 polishes the second insulating layer 112 down to a first level 116, thus planarizing the surface of the second insulating layer 112.

Figure 1C:
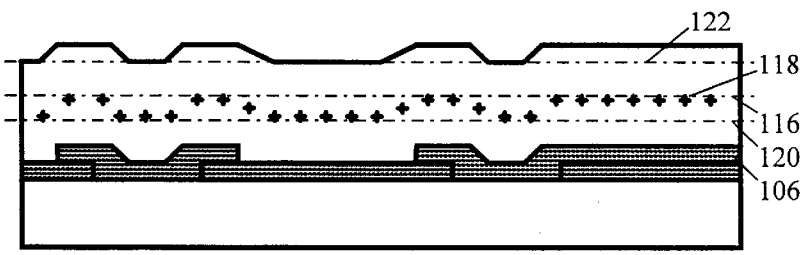
Figure 2:
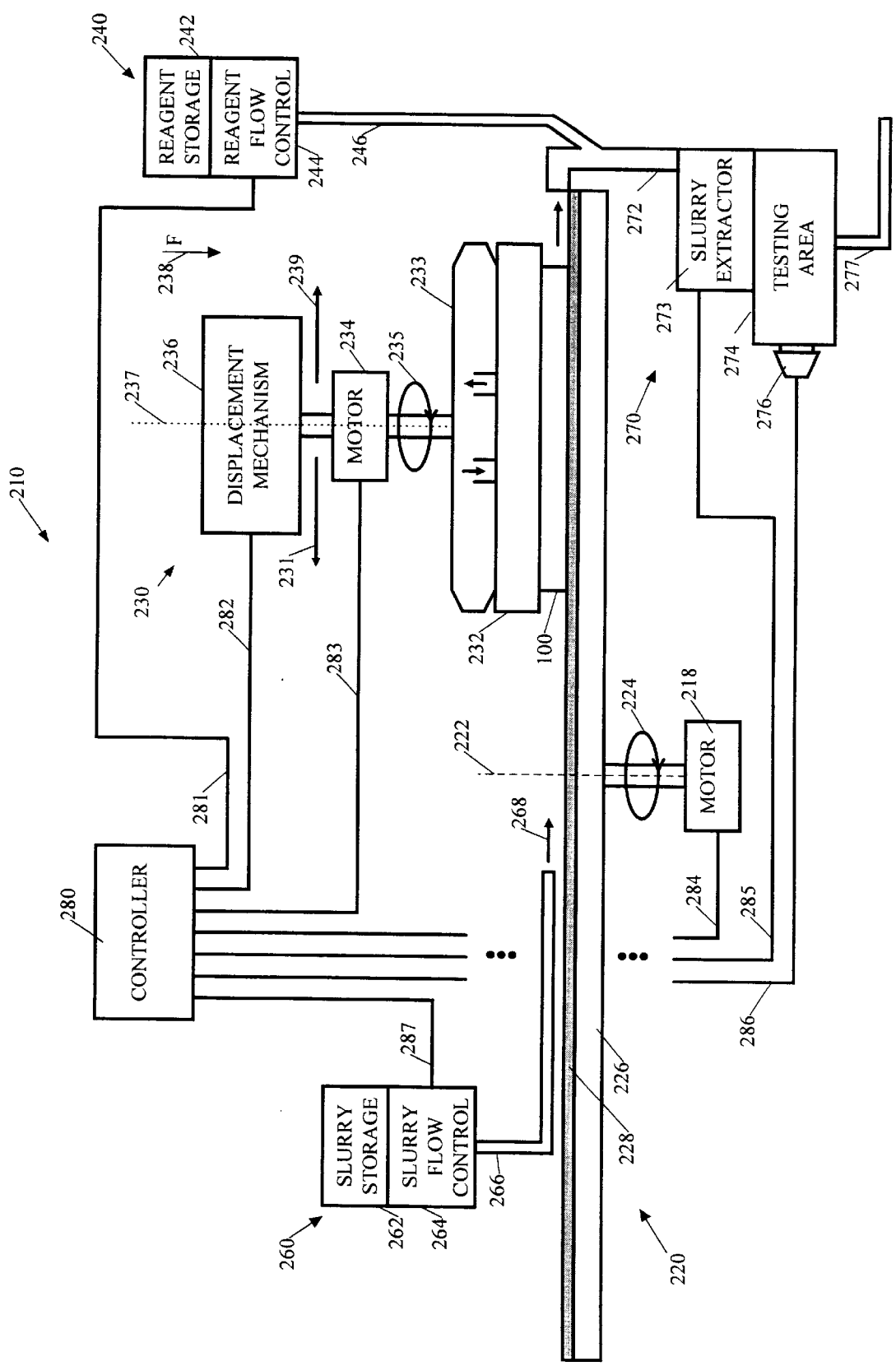
FIG. 2 shows an embodiment of a polishing system which incorporates various features of the present invention therein.

In order to enable the polishing system 210 of FIG. 2 to accurately determine when the first level 116 is reached, the fabrication process implants a polishing endpoint layer 118 into the second insulating layer 112. As will be discussed in more detail below, the polishing endpoint layer 118 in the present invention includes a catalyst material which the polishing system 210 uses in determining a polishing endpoint. As shown in FIG. 1C, the implanted polishing endpoint layer 118 starts at the first level 116 and ends at a second level 120 that lies above the first metal layer 106. Methods of ion implanting material into a semiconductor wafer are well known in the art. Accordingly, ion implantation techniques are not described herein.

However, it should be appreciated by those skilled in the art, that implantation techniques distribute the implanted material at various depths from the surface of implantation with a peak distribution occurring at the desired depth. Accordingly, implantation techniques implant some material at a depth greater than the desired depth and implant some material at a depth less than the desired depth. Since implantation of the material into underlying layers may result in reliability problems, the implantation technique should ensure that the underlying layers such as the first metal layer 106 are not contaminated with the implanted material. Furthermore, since the polishing system 210 utilizes the implanted material of the polishing endpoint layer 118 to determine the polishing endpoint, the implantation technique should implant the material of the polishing endpoint layer 118 such that the polishing endpoint layer 118 starts below a second level 122 that corresponds to the lowest part of the surface to be planarized.

The implantation technique also tends to create a non-planar polishing endpoint layer 118 due to the uneven surface topography of the second insulating layer 112. Since the implantation technique implants the material of the polishing endpoint layer 118 through the surface of the second insulating layer 112, the implanted polishing endpoint layer 118 generally follows the topography of the second insulating layer 112. As a result, the implantation technique needs to account for the uneven topography of the second insulating layer 112 when determining the desired depth of the implanted polishing endpoint layer 118. In some cases it may be desirable to polish the surface of the semiconductor wafer 100 prior to implanting the polishing endpoint layer 118 in order to lessen variations in the surface topography of the second insulating layer 112. Polishing the second insulating layer 112 prior to implanting the polishing endpoint layer 118 generally generates a more planar polishing endpoint layer 118, thus making it easier to implant a polishing endpoint layer 118 which is (i) deep enough to cause the polishing system 210 to planarize the semiconductor wafer 100, and (ii) not deep enough to cause the implantation technique to contaminate underlying layers with implanted material.

Figure 1D:
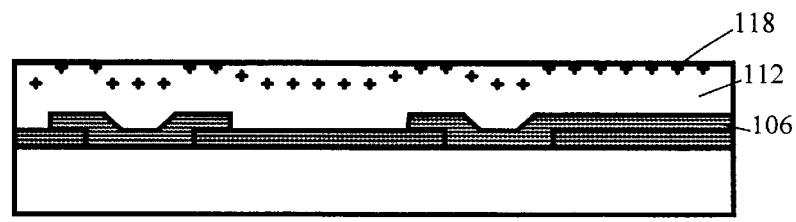
Figure 1E:
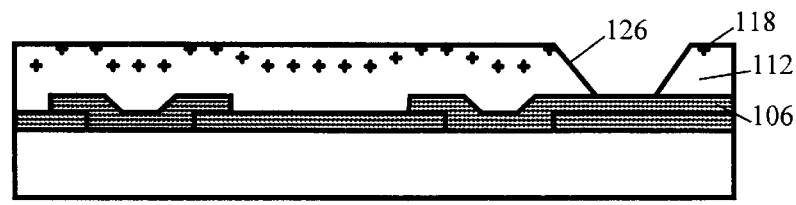
Figure 1F:
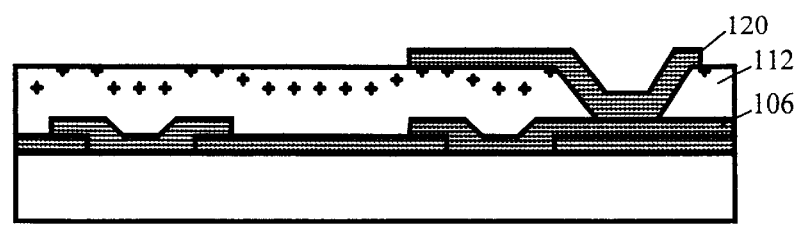

FIG. 1D shows the semiconductor wafer 100 after the polishing system 210 has polished the semiconductor wafer 100 down to the polishing endpoint layer 118. As depicted, the semiconductor wafer 100 has a planar surface upon which additional layers may be fabricated. For example, the fabrication process may etch a via 126 through the second insulating layer 112 and the polishing endpoint layer 118 (FIG. 1E). Then, the fabrication process may pattern a second metal layer 120 upon the second insulating layer 112 and the polishing endpoint layer 118 as shown in FIG. 1F. It should be appreciated that depending upon (i) the nature of the additional layer that the fabrication process is to form upon the planarized surface of the semiconductor wafer 100 and (ii) the material of the implanted polishing endpoint layer 118, the fabrication process may need to form a third insulating layer upon the planarized surface prior to forming the additional layer in order to insulate the additional layer from the polishing endpoint layer 118.

Referring now to FIG. 2, there is shown a preferred embodiment of a polishing system 210 which planarizes a front side or surface of a semiconductor wafer or device. To this end, the polishing system 210 includes a platen motor or other drive mechanism 218 and platen subassembly 220. The platen motor 218 rotates the platen subassembly 220 about a center axis 222 at a platen velocity $V_p$. The platen motor 218 may rotate the platen subassembly 220 in a clockwise direction as shown by arrow 224 or in the counterclockwise direction.

The platen subassembly 220 includes a polishing platen 226 and polishing pad 228 mounted upon the polishing platen 226. Both the polishing platen 226 and the polishing pad 228 are preferably circular and define a polishing surface against which the polishing system 210 may polish the semiconductor wafer 100. Moreover, the polishing pad 228 is typically made of blown polyurethane which protects the polishing platen 226 from chemical slurry and other chemicals introduced during the polishing process.

The polishing system 210 also includes a polishing head subassembly 230. The polishing head subassembly 230 includes a wafer carrier 232, a cooling mechanism 233, a carrier motor or other drive mechanism 234, and a wafer carrier displacement mechanism 236. The wafer carrier 232 applies a controlled adjustable downward force F (as illustrated by arrow 238) to press semiconductor wafer 100 into polishing pad 228 to facilitate polishing of the front side of the semiconductor wafer 100. The carrier motor 234 rotates wafer carrier 232 and semiconductor wafer 100 about a center axis 237 at a wafer velocity $V_w$. The carrier wafer may rotate the wafer carrier 232 in a clockwise direction as shown by arrow 235 or in the counterclockwise direction. However, the carrier motor 234 preferably rotates the wafer carrier 232 in the same rotational direction as platen motor 218 rotates the platen subassembly 220 (although the carrier motor 234 may rotate the semiconductor wafer 100 in the rotational direction opposite the rotational direction of the platen subassembly 220 as desired).

The wafer carrier 232 also includes mechanisms (not shown) for holding the semiconductor wafer 100. For example, the wafer carrier 232 may include a vacuum-type mechanism which generates a vacuum force that draws the semiconductor wafer 100 against the wafer carrier 232. Once the semiconductor wafer 100 is positioned on the wafer carrier 232 and held in contact with the platen subassembly 220 for polishing, the vacuum force may be removed. In such an arrangement, the wafer carrier 232 may be designed with a friction surface or a carrier pad which engages the back side of the semiconductor wafer 100. Furthermore, the carrier pad and downward force F create a frictional force between the wafer carrier 232 and the semiconductor wafer 100 that effectively holds the semiconductor wafer 100 against the wafer carrier 232 and causes the semiconductor wafer 100 to rotate at the same velocity as the wafer carrier 232. Such wafer carriers and carrier pads are of conventional design and are commercially available.

Moreover, the cooling mechanism 233 counteracts heat generated during the polishing process in order to maintain the wafer carder 232 at a substantially constant temperature. In particular, the cooling mechanism neutralizes the heat generated due to (i) friction and (ii) the chemical slurry reacting with the front side of the semiconductor wafer 100.

The displacement mechanism 236 moves the wafer carrier 232 and the semiconductor wafer 100 under a controlled force F across the platen subassembly 220 as indicated by arrows 231 and 239. The semiconductor wafer 100 is moved at an adjustable rate and along a variable polishing path P. The polishing path P may be linear, sinusoidal, or a variety of other patterns. The wafer carrier displacement mechanism 236 is also capable of moving the semiconductor wafer 100 along a polishing path to a location beyond the edge of the polishing pad 228 so that the semiconductor wafer 100 "overhangs" the edge. This overhang arrangement permits the semiconductor wafer 100 to be moved partially on and partially off the polishing pad 228 to compensate for polishing irregularities caused by a relative velocity differential between the faster moving outer portions and the slower moving inner portions of the platen subassembly 220.

The polishing system 210 also includes a reagent supply system 240 and a chemical supply system 260. The reagent supply system 240 includes a reagent storage 242, a reagent flow control mechanism 244, and a reagent conduit 246. The reagent storage 242 includes one or more containers for storing reagents. In particular, the reagent storage 242 stores reagents which react in the presence of the catalyst material of the polishing endpoint layer 118. Illustratively, the reagent storage 242 may store t-butyl bromide (i.e. $(CH_3)_3CBr$) which catalytically reacts with water (i.e. $H_2O$) in the presence of silver ions (i.e. Ag+) of the polishing endpoint layer 118. The above reaction may be represented by the following chemical equation:

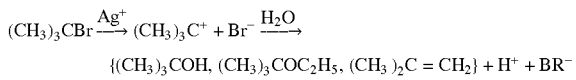

The above chemical reaction is disclosed in more detail in the article Heterogeneous Catalysis in Solution, (Catalysis by Silver Bromide and other Solids of the Solvolysis of t-Butyl Bromide in 80 vol% Ethanol+Water), by Ester F. G. Barbosa, Roger J Mortimer and Michael Spiro, *J. Chem. Soc., Faraday Trans.* 1, 1981, the disclosure of which is hereby incorporated by reference.

However, it should be appreciated that the above reagent and catalyst material are merely exemplary and that many other reagents and catalyst materials may be suitable for use with the polishing system 210. For example, t-butyl bromide may be replaced with a hydrocarbon of similar stereochemistry that is similarly halogenated and the silver ions may be replaced with mercury ions (i.e. $Hg^{2+}$).

The reagent flow control mechanism 244 controls the flow of reagent through the reagent conduit 246, and the reagent conduit 246 connects the reagent supply system 240 to the extraction conduit 272 of the endpoint detector 270 (discussed below) so that reagent may be transferred from the reagent supply system 240 to the testing area 274 of the endpoint detector 270. To this end, the reagent flow control mechanism 244 and the reagent conduit 246 transfer reagent from the reagent storage 242 to the extraction conduit 272 at a reagent flow rate $\Phi_R$ such as 0.5 moles a second of reagent (e.g. t-butyl bromide) for 1–10 cubic centimeters a second (ccls) of effluent flowing through the extraction conduit 272.

The slurry supply system 260 includes a slurry storage 262, a slurry flow control mechanism 264, and a slurry conduit 266. The reagent storage 262 includes one or more containers for storing slurry. In a preferred embodiment, the slurry storage 262 stores a slurry that includes alumina (i.e. $AlO_3$) which is an abrasive material that facilitates polishing of the front side of the semiconductor wafer 100 and reactants which selectively react to certain materials of the front side of the semiconductor wafer 100. Chemical slurries having such properties are well known and commercially available. Moreover, in the preferred embodiment the slurry stored in the slurry storage 262 is sufficiently acidic to dissolve silver ions of the polishing endpoint layer 118. It should be appreciated that the polishing system 210 may be constructed without the reagent supply system 240 if the reagents are included in the chemical slurry of the slurry supply system 260.

The slurry flow control mechanism 260 controls the flow of slurry through the slurry conduit 266, and the slurry conduit 256 transfers the slurry from the slurry storage 262 to the polishing area atop platen subassembly 220. To this end, the slurry flow control mechanism 264 and the slurry conduit 266 introduce slurry as indicated by arrow 268 atop the polishing pad 228 at a slurry flow rate $\Phi_S$.

The polishing system 210 further includes an endpoint detector 270. The endpoint detector 270 includes an extraction conduit 272, an extraction flow control mechanism 273, a testing area 274, a sensor 276, and a waste conduit 277. The extraction conduit 272 receives effluent from the polishing area atop platen subassembly 220. The effluent may include the chemical slurry of the slurry supply system 260, and materials removed from the semiconductor wafer 100. The extraction flow control mechanism 273 controls the flow of effluent from the extraction conduit 272 to the testing area 274. To this end, the extraction flow control mechanism 273 and the extraction conduit 272 introduce effluent to the testing area 274 at an extraction rate $\Phi_E$. Moreover, the extraction flow control mechanism 273 includes a membrane which filters various unknown solids from the testing area 274. In a preferred embodiment, the membrane of the extraction flow control mechanism 273 has a pore size that is slightly larger than the alumina included in the chemical slurry.

The waste conduit 277 of the endpoint detector 270 connects the testing area 274 to a waste treatment facility (not shown). The waste conduit 277 transfers the effluent at a waste flow rate Ow from the testing area 274 to a waste treatment facility that treats and properly disposes of the effluent.

The sensor 276 is operable to analyze the effluent present in the testing area 274 and generate an endpoint detection signal when the effluent has a particular characteristic that is indicative of the polishing endpoint being reached. To this end, the sensor 276 is operable to determine whether the reagents of the reagent supply system 240 have reacted or are reacting catalytically. For example, since the above chemical reaction lowers the pH level of the effluent, the sensor 276 in a preferred embodiment includes a digital pH meter that (i) measures the amount of hydrogen ions (i.e. H+) present in the effluent, and (ii) generates the endpoint signal in response to the determining that the effluent in the testing area has become sufficiently acidic (i.e. the pH level of the effluent has dropped below a predetermined level)

Alternatively, the sensor 276 may be an optical sensor which is operable to detect a color change in the effluent. An indicator such as phenolphthalein may be introduced into the testing area 274 which causes the effluent to change color when the pH level of the effluent crosses a predetermined pH level. Accordingly, the optical sensor of endpoint detector 270 may monitor the color of the effluent in the testing area 274 and generate the endpoint detection signal in response to detecting that the effluent has changed color.

The polishing system 210 further includes a controller 280 for controlling the polishing system 210 in order to effectuate the desired polishing results for the semiconductor wafer 100. The controller 280 is operatively coupled to the components of the polishing system 210 via connectors 281–287 in order to monitor and control in real-time the components of the polishing system 210. In particular, the controller 280 is configured to control the reagent flow rate $\Phi_R$, the slurry flow rate $\Phi_S$, the extraction rate $\Phi_E$, the polishing path P, the wafer velocity $V_W$, and the platen velocity $V_P$. The controller 280 may be implemented with a microcontroller, an ASIC, discrete circuit components, or any combination of the above. Furthermore, the controller 280 may include computational means for calculating specific parameters and memory for storing software routines and parameters.

More specifically, the controller 280 is coupled to the reagent flow control mechanism 244 via a connector 281 to monitor and adjust the reagent flow rate $\Phi_R$. The controller 280 is coupled to the displacement mechanism 236 via connector 282 to monitor and controllably adjust the polishing path P of the semiconductor wafer 100 and the speed at which the semiconductor wafer 100 is moved across the platen subassembly 220. The controller 280 is coupled to the carrier motor 234 via connector 283 to monitor the motor rpm and wafer velocity $V_W$ imparted by the wafer carrier 232 and to adjust the speed of the wafer carrier 232 as desired. The controller 280 is coupled to platen motor 218 via connector 284 to monitor the motor rpm and platen velocity $V_P$ of platen subassembly 220, and to adjust the speed of the platen subassembly 220 as desired. The controller 280 is coupled to the extraction flow control mechanism 273 via a connector 285 to monitor and adjust the flow rate $\Phi_E$ of the effluent. The controller 280 is coupled to the sensor 276 of the endpoint detection system 270 via a connector 286 to monitor the endpoint detection signal generated by the endpoint detection device 270. The controller 280 is coupled to the slurry flow control mechanism 264 via a connector 287 to monitor and adjust the slurry flow rate $\Phi_S$.

Prior to operating the polishing system 210, a fabrication process forms in the semiconductor wafer 100 a polishing endpoint layer 118 that includes catalyst material. In particular, the fabrication process forms the polishing endpoint layer 118 at a predetermined distance from the surface of the semiconductor wafer 100, the substrate 102, or another layer of the semiconductor wafer 100. Then, the wafer carrier 232 engages the back side of the semiconductor wafer 100 and presses the front side of the semiconductor wafer 100 against the polishing pad 228 with a force F. The controller 280 causes (i) the platen motor 218 to rotate the platen subassembly 220 at a platen velocity $V_P$ (ii) the carrier motor 234 to rotate the wafer carrier 232 at a wafer velocity of $V_W$, (iii) the displacement mechanism 236 to execute a polishing path P, and (iv) the slurry flow control mechanism 264 to apply chemical slurry to the polishing pad 228 at a slurry flow rate $\Phi_S$. The resulting complex movement of the wafer carrier 232 relative to the polishing pad 228, the force F. and the chemical slurry all cooperate to remove material from the front side of the semiconductor wafer 100.

Once the polishing system 210 is close to the polishing endpoint layer 118, the controller 280 causes (i) the reagent flow control mechanism 244 to transfer reagent to the extraction conduit 272 at a reagent flow rate $\Phi_R$, and (ii) the extraction flow control mechanism 273 to extract effluent from the polishing pad 228 at an extraction rate $\Phi_E$. The endpoint detector 270 then generates an endpoint signal once the endpoint detector 270 detects that the reagent has catalytically reacted due to the extracted effluent containing the catalyst material of the polishing endpoint layer 118. In response to the endpoint detector 270 generating the endpoint signal, the controller 280 terminates the polishing of the semiconductor wafer 100 since the semiconductor wafer 100 has a planar surface with an even topography when the polishing system 210 polishes the semiconductor wafer 100 down to the polishing endpoint layer 118.

Figure 3:
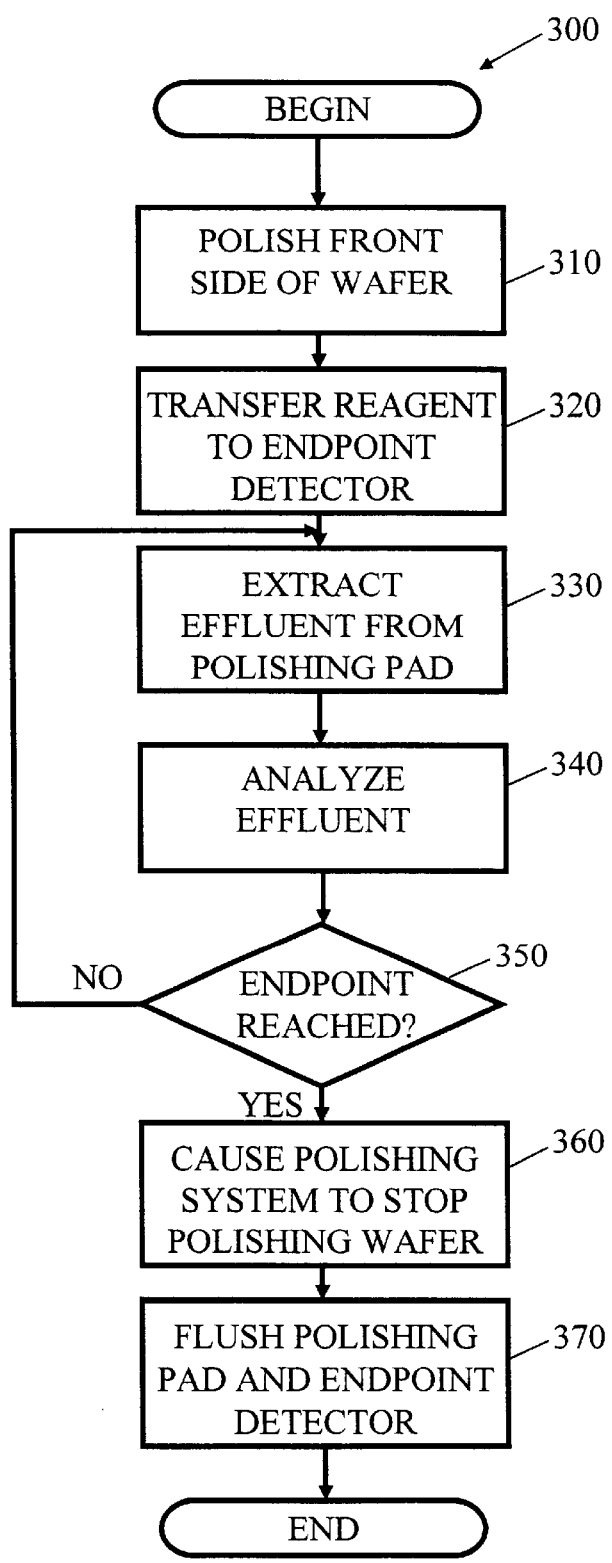
FIG. 3 shows a flowchart of a polishing procedure used by the polishing system of FIG. 2.

FIG. 3 illustrates a polishing procedure 300 utilized by polishing system 210. The controller 280 in step 310 of the polishing procedure 300 causes the polishing system 210 to begin polishing the front side of the semiconductor wafer 100 in order to remove material from the front side of the semiconductor wafer 100. To this end, the controller 280 causes the wafer carrier 232 to rub the front side of the semiconductor wafer 100 against the platen subassembly 220. Moreover, the controller 280 causes the chemical slurry supply system 260 to apply chemical slurry atop platen subassembly in order to facilitate the removal of material from the front side of the semiconductor wafer 100.

After a predetermined amount of polishing time has elapsed, the controller 280 in step 320 causes the reagent supply system 240 to transfer reagent to the extraction conduit 272 of the endpoint detector 270. The predetermined amount of polishing time is close to but less than the amount of polishing time required for the polishing system 210 to reach the polishing endpoint layer 118. Waiting until the polishing system 210 is closer to the polishing endpoint layer 118 before applying the reagent helps conserve the amount of reagent consumed by the polishing system 210.

Then, the controller in step 330 causes the extraction flow control 273 of the endpoint detector 270 to introduce effluent extracted from the platen subassembly 220 by the extraction conduit 272 into the testing area 274. The endpoint detector 270 then analyzes in step 340 the effluent in order to determine whether the catalyst material of the polishing endpoint layer 118 has caused the reagent of the reagent supply system 240 to catalytically react.

Since in the preferred embodiment the reagent (t-butyl bromide) catalytically reacts with water in the presence of the catalyst material (silver ions) to produce hydrogen ions, the sensor 276 of the preferred embodiment in step 350 determines whether the reagent has caused the pH level of the effluent to drop below a predetermined level. As discussed above, the sensor 276 may include a digital pH meter which detects the amount of hydrogen ions present in the effluent. Alternatively, the sensor 276 may include an optical sensor which detects whether a pH indicator such as phenolphthalein has caused the effluent to change color. If sensor 276 determines that the reagent has catalytically reacted, then the sensor 276 transmits an endpoint signal to the controller 280; otherwise, the polishing system 210 returns to step 330 to extract more effluent.

In response to receiving the endpoint signal, the controller 280 in step 360 causes the polishing system 210 to stop polishing the semiconductor wafer 100. It should be appreciated that the controller 280 may allow the polishing system 210 to continue polishing the semiconductor wafer 100 for a predetermined amount of time in order to further remove material from the semiconductor wafer 100. This further removal of material or overpolishing may be desirable after certain steps of a fabrication process.

The controller 280 then in step 370 flushes the catalyst material from the polishing platen 220 and the endpoint detector 270. In particular, the controller 280 causes the chemical slurry to be applied to the polishing platen 220 for a predetermined period of time. The continual application of the chemical slurry after the polishing system 210 has stopped polishing the semiconductor wafer 100 helps flush the catalyst material of the polishing endpoint layer 118 from the platen subassembly 220 and the endpoint detector 270 so that the endpoint detector 270 may detect the endpoint of the next semiconductor wafer to be polished.

Since in the preferred embodiment, the catalytic reaction detected by the endpoint detector 270 requires catalyst material and no other materials from the polishing endpoint layer 118, a small amount of material removed from the polishing endpoint layer 118 can trigger a substantial catalytic reaction. This amplification effect enables the endpoint detector 270 to cost effectively detect presence of a small amount of polishing endpoint layer material by detecting a substantial catalytic reaction instead of trying to directly detect material removed from the polishing endpoint layer 118.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected. For example, while the polishing endpoint layer 118 has been described as being implanted into the semiconductor water 100, other methods of forming the polishing endpoint layer 118 may also be used. For example, U.S. Pat. No. 5,668,063 to Fry et al., the disclosure which is hereby incorporated by reference, discloses forming a tracer layer upon other layers. This method of forming a tracer layer may be suitable for forming the catalytic polishing endpoint layer 118 used by the polishing system 210 of the present invention.

What is claimed is:

1. An apparatus for polishing a semiconductor wafer down to a catalyst material of said wafer, said wafer having a first side and a second side, comprising:

a polishing platen having a polishing surface;

a wafer carrier configured to (i) engage said wafer by said second side of said wafer and (ii) press said first side of said wafer against said polishing surface of said polishing platen;

a slurry supply system configured to apply a chemical slurry to said first side of said wafer which (i) facilities removal of material from said wafer, and (ii) receives said material removed from said wafer carrier, wherein said polishing platen and said wafer carrier are configured to rub said first side of said wafer against said polishing surface in the presence of said chemical slurry in order to remove said material from said wafer; and a polishing endpoint detector that is operable to (i) detect based upon said chemical slurry whether a catalytic reaction has occurred due to said polishing platen removing a portion of said catalyst material from said wafer, and (ii) cause said polishing of said wafer to terminate in response to detecting said catalytic reaction.

2. The apparatus of claim 1, wherein said polishing endpoint detector comprises:

a slurry extractor that is operable to extract said chemical slurry from said polishing platen to a testing area.

3. The apparatus of claim 2, further comprising:

a reagent supply system which is operable to add a reagent to said chemical slurry in said testing area which catalytically reacts with said chemical slurry when said chemical slurry includes said catalyst material.

4. The apparatus of claim 2, further comprising:

a reagent supply system which is operable to add a plurality of reagents to said chemical slurry in said testing area which catalytically react when said chemical slurry includes said catalyst material.

5. The apparatus of claim 1, further comprising:

a reagent supply system which is operable to add a reagent to said chemical slurry, wherein said reagent catalytically reacts when said chemical slurry includes said catalyst material.

6. The apparatus of claim 5, wherein:

said reagent is t-butyl bromide, and said catalyst material is selected from a group of ions comprising silver ions and mercury ions.

7. The apparatus of claim 1, further comprising:

a reagent supply system which is operable to add a plurality of reagents to said chemical slurry, wherein said plurality of reagents catalytically react when said chemical slurry includes said catalyst material.

8. The apparatus of claim 1, further comprising:

a reagent supply system which is operable to add a reagent to said chemical slurry after said wafer carrier and said polishing platen have rubbed said first side of said wafer for a predetermined period.

* * * * *